United States Patent [19]
Buchmüller et al.

[11] Patent Number: 4,702,553
[45] Date of Patent: Oct. 27, 1987

[54] FIBER-OPTICAL SENSOR FOR DETECTING ELECTRIC ARC-DISCHARGES

[75] Inventors: Reino Buchmüller, Heddesheim; Bernd Weissenborn, Laudenbach, both of Fed. Rep. of Germany

[73] Assignee: BBC Brown, Boveri & Company, Limited, Baden, Switzerland

[21] Appl. No.: 400,154

[22] Filed: Jul. 20, 1982

[30] Foreign Application Priority Data

Jul. 23, 1981 [DE] Fed. Rep. of Germany ....... 3129041

[51] Int. Cl.$^4$ ............................. G02B 6/02; G02B 6/16
[52] U.S. Cl. .................................................. 350/96.29
[58] Field of Search ........................ 350/96.29; 250/227

[56] References Cited

U.S. PATENT DOCUMENTS 4,409,476 10/1983 Löfgren et al. ...................... 250/227
4,418,338 11/1983 Burt ..................................... 250/227

Primary Examiner—Robert E. Wise
Attorney, Agent, or Firm—Burns, Doane, Swecker & Mathis

[57] ABSTRACT

Fiber-optical sensor for detecting electric arc-discharges. An optical waveguide serves to detect electric arc-discharges in an enclosed space, this waveguide being designed, in its detecting or active zone, as a heavily curved spiral. Testing light is fed in at the beginning of the optical waveguide, from a source of testing light. An optical filter, matched to the testing light, is located at the exit from the optical waveguide, this filter directing the light, resulting from a fault, and coming from the arc, up to a first photo-receiver. Sound waves, which are likewise emitted from the arc-discharge, modulate the testing light in the interior of the spiral. The modulated testing light passes to a second photoreceiver. The changes in the luminous intensity at the two photoreceivers are recorded in an electronic evaluator, and the time-difference is determined.

9 Claims, 3 Drawing Figures

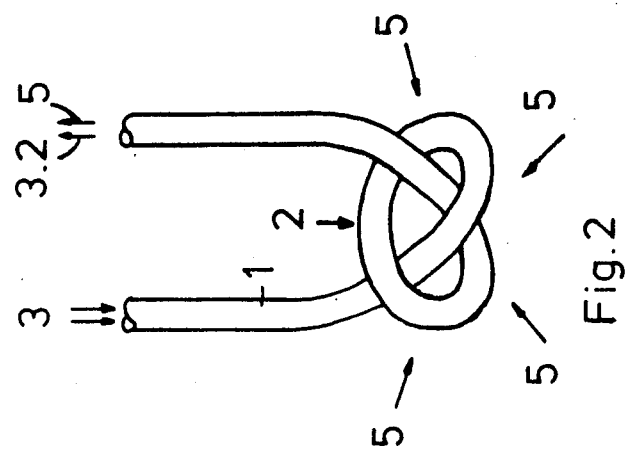
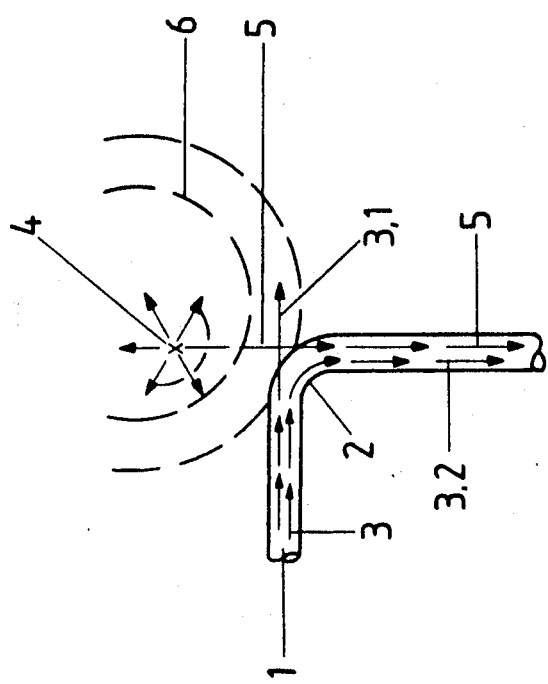

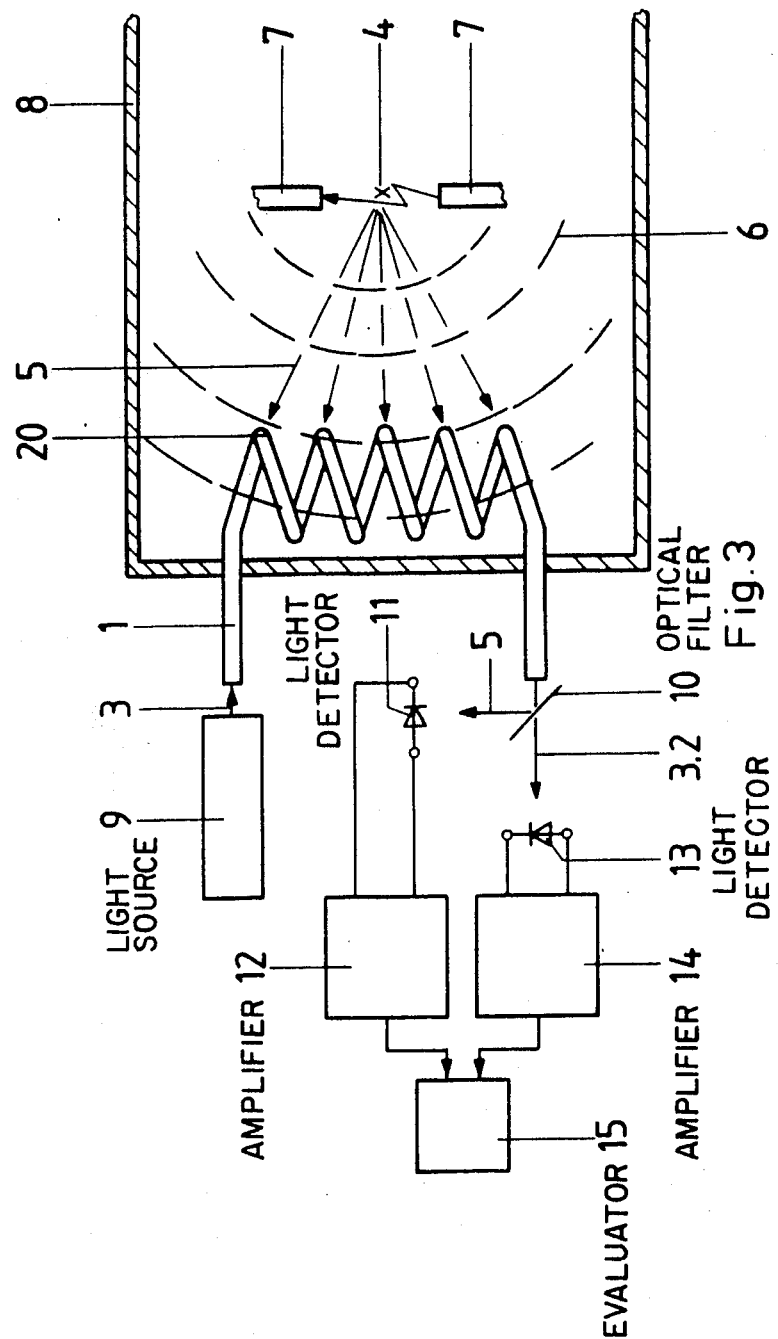

FIBER-OPTICAL SENSOR FOR DETECTING ELECTRIC ARC-DISCHARGES

BACKGROUND AND SUMMARY OF THE PRESENT INVENTION

The present invention relates generally to sensing devices. More specifically, the present invention relates to a fiber-optical sensor for detecting electric arc-discharges. The sensor is used in a system having a source of testing light and photoreceiver.

Optical waveguides can detect and transmit light pulses occurring within the acceptance angle of the waveguides. The acceptance angles of known optical waveguides usually lie between 18° and 46°, and are therefore almost too small for many possible applications, for example as sensors for detecting electric arc-discharges in enclosed high-voltage switching systems. However, optical waveguides have the advantages of high electromagnetic compatibility and good potential-isolation, so that there is a desire to use them in many cases.

For safety and reliability reasons, it is necessary to check the functional serviceability of the sensors on a continuous basis. These checks are conventionally carried out with the aid of testing-light pulses, which are led, by a second optical waveguide, into the space which is to be monitored. The testing light pulses are then radiated onto the detection point of the optical waveguide, within the acceptance angle.

On account of the distance and of the radiating angle, the optical waveguide serving as the sensor receives only a small portion of the testing light again. The greater the distance between the two optical waveguides, the smaller is the quantity of testing light which is radiated into the sensor. Since a minimum radiant flux is necessary for reliable detection, and the luminous intensity decreases as the fourth power of the distance, the two optical waveguides must be adjusted so that they are a short distance apart and, as nearly as possible, on one line.

The radiation source emitting the light pulses which are to be detected must also be located within the acceptance angle of the optical waveguide serving as the sensor, that is to say, it must generally be located between the two optical waveguides. As a result of this requirement, considerable problems arise, related purely to design, since either the radiation source is so large that it cuts off the testing light, or there is otherwise the danger of the arc-discharge itself damaging the optical waveguides, for example in the case of a high-voltage switch.

One object underlying the present invention is to design a fiber-optical sensor for detecting electric arc-discharges in such a manner that light pulses can be received from a very large acceptance angle, without problems arising in connection with the testing light.

This object and others are achieved by an optical waveguide, which is heavily curved in its detecting or active zone. At the end of the optical waveguide, the testing light and discharge light are respectively converted into electrical signals, and processed, an optical/electrical unit being used for this purpose. Differentiation between testing light and radiated light is most simply effected on the basis of the intensity of the radiation, the duration of the light pulses, or the moment in time at which the light pulses are received.

Differentiation between testing light and light from the arc-discharge can also be effected by a continuously-operating source of testing light, located at the beginning of the optical waveguide. The differentiation can also be effected by an optical filter, located at the end of the optical waveguide and matched to the testing light, by a first photoreceiver for the testing light, and by a second photoreceiver for the light from the arc-discharge.

The invention utilizes the knowledge that light can emerge from the optical waveguide, or enter the optical waveguide, at the location where the optical waveguide is heavily curved. The proportion of the light which emerges, just as the proportion of the light which is coupled-in, is a function of the radius of curvature, and of the length over which the optical waveguide is curved. The radius and the length must accordingly be adjusted so that, of the testing light which is fed in at one end of the optical waveguide, sufficient energy still arrives at the exit to permit reliable detection, and that sufficient light is absorbed, from the electric arc-discharge, that it is likewise reliably detected. To detect the light from the arc, it is sufficient to design the active zone of the optical waveguide as a sharp kink, or as a knot.

In a further embodiment of the present invention, the invention utilizes the fact that an electric arc-discharge not only generates light, but also generates sound waves. In accordance with their travel time, these sound waves reach the sensor location later than the light waves, and modulate the testing light which is guided within the optical waveguide. When operating with coherent light, this modulation results from a change in the phases of the modes, and, when operating with non-coherent light, it takes place as a result of a change in the quantity of light being radiated from the curved surfaces of the optical waveguide. However, in both cases, the sound waves result in the intensity of the testing light being modulated at the end of the optical waveguide. Suitable optical filters are used to separate the modulated testing light from the light which is coupled-in from the arc-discharge.

Depending on the amount of energy required, a laser or a luminescent diode can be used as the sources of testing light, or even a photoflash lamp can be used. If a photoflash lamp is used as the source of testing light, it is necessary for the source of testing light to be time-synchronized with the testing-light receiver.

The active zone of the optical waveguide is advantageously designed in the form of a spiral, thus enabling the light from the arc-discharge to be detected from virtually all sides.

The sensors according to the invention are preferentially used in high-voltage switching systems, or in transformer tanks.

Further developments of the invention, and the advantages thereof, are evident from the description, in the text which follows.

BRIEF DESCRIPTION OF THE DRAWINGS

Preferred embodiments of the present invention are described with reference to the accompanying drawings, in which FIG. 1 is a schematic side elevational view of the coupling-out and coupling-in of light, in the case of a first preferred embodiment of a curved optical waveguide, FIG. 2 is a schematic side elevational view of a second preferred embodiment of an optical waveguide having a particularly simple and effective design of the active zone, and FIG. 3 is a schematic side elevational view, partially in cross-section, of a third preferred embodiment of an optical waveguide the waveguide being used as a sensor, according to the invention, for arc-detection in an enclosed switching system.

DETAILED DESCRIPTION OF THE PREFERRED EMBODIMENTS

In FIG. 1, an optical waveguide 1 can be recognized, which is heavily curved in its detecting or active zone 2. Testing light 3, from a testing-light source (not represented), reaches the active zone 2, where a portion 3.1 of the testing light leaves the optical waveguide, while another portion 3.2 continues to travel in the optical waveguide 1. Both light waves 5 and sound waves 6 leave an arc-discharge 4. In the active zone 2, the light waves 5 are coupled into the optical waveguide 1, and travel in the optical waveguide, together with the portion 3.2 of testing light, to a photoreceiver (not represented). The sound waves 6 exert an influence on the optical waveguide 1, and modulate that portion 3.2 of the testing light 3 which is travelling in the optical waveguide 1.

With reference now to FIG. 2, the optical waveguide 1 has a configuration of the active zone 2, in the form of a knot. The ratio between the proportion 3.2 of testing light and the measurement-light 5 can be adjusted in accordance with the curvature conditions which arise on making this knot.

With reference now to FIG. 3, the optical waveguide is incorporated in a high-voltage switching system, represented by the enclosure 8, and the switch-electrodes 7. The electric arc-discharge burns between the two electrodes 7, this discharge emitting the light waves 5 and the sound waves 6. The active zone of the optical waveguide 1 is designed in the form of a spiral 20. The diameter and length of the spiral 20 are chosen such that an adequate quantity of the testing light 3, produced by a testing-light source 9, reaches the receiving device at the end of the optical waveguide 1. An optical filter 10, which is matched to the testing light, is located at the end of the optical waveguide 1, this filter ensuring that the light 5, leaving the arc-discharge, reaches a first receiving device 11, for example, a photodiode, where it is converted into corresponding electrical signals. That portion 3.2 of the testing light, which is guided in the spiral waveguide, and which is additionally modulated by the sound waves 6, reaches a second opto-electric receiving device 13, for example, once again a photodiode, and is there likewise converted into electrical signals. The signals from the two opto-electric receiving devices 11, 13 are amplified and evaluated in separate electronic units 12 and 14, respectively. The output signals then pass onwards to an electronic evaluation 15, in which the time difference between the reaction of the first receiving device 11, to the light 5 from the arc-discharge 4, and the reaction of the second receiving device 13, to the modulation of the portion 3.2 of testing light, caused by the sound waves 6, is calculated.

The determination of the time difference enables, with the aid of the known sound-propogation velocity the deduction of the distance of the arc-discharge from the sensor. In this way, by using a plurality of sensors inside the enclosure 8, it is possible to determine the position of the arc-discharge, in a precise manner. This is particularly advantageous when, for example, it is intended to use these sensors for monitoring a transformer, which is customarily installed in a tank, for arc-discharges, insulation-breakdowns, etc.

The principles, preferred embodiments and modes of operation of the present invention have been described in the foregoing specification. The invention which is intended to be protected herein should not, however, be construed as limited to the particular forms disclosed, as these are to be regarded as illustrative rather than restrictive. Variations and changes may be made by those skilled in the art without departing from the spirit of the present invention. Accordingly, the foregoing detailed description should be considered exemplary in nature and not as limiting to the scope and spirit of the invention as set forth in the appended claims.

List of reference numbers

1. Optical waveguide,
2. Active zone,
3. Testing light,
3.1, 3.2 Portions of testing light,
4. Arc-discharge,
5. Light waves,
6. Sound waves,
7. Electrodes,
8. Enclosure,
9. Testing-light source,
10. Optical filter,
11, 13 Receiving devices,
12, 14 Electronic unit,
15. Electronic evaluator,
20. Spiral

We claim:

1. A fiber optic sensor for detecting electric arc-discharges of the type accompanied by sound waves, said sensor comprising:
   an optical fiber, a portion of which being arranged to be subject to electric arc-discharges of the type accompanied by sound waves, whereby light waves produced by an electric arc-discharge are transmitted through said optical fiber,
   a test light source disposed at an end of said optical fiber for transmitting a test light through the optical fiber, which test light is modulated by sound waves accompanying an electric arc-discharge,
   a first light detector disposed at another end of said optical fiber for receiving said test light modulated by the sound waves, and
   a second light detector disposed at said other end of said optical fiber for receiving said arc-produced light waves.

2. A sensor according to claim 1 including an optical filter mounted at said other end of said optical fiber to divert said test light to said first light detector and divert said arc-produced light waves to said second light detector.

3. A sensor according to claim 2, wherein said portion of said optical fiber includes a region which is sharply curved.

4. A fiber optic sensor according to claim 3, wherein said region of said optical fiber is spiral-shaped.

5. A fiber optic sensor according to claim 3, wherein said region of said optical fiber is knot-shaped.

6. A sensor according to claim 2 including an electronic evoluator connected to said first and second light detectors for determining the time difference between the reaction of said first light detector to the modulation of said test light on the one hand and the reaction of said second light detector to the arc-produced light waves on the other hand.

7. A fiber optic sensor according to claim 1, wherein said test light source comprises a photoflash lamp.

8. A fiber optic sensor according to claim 1, wherein said test light source comprises a luminescent diode.

9. A fiber optic sensor according to claim 1, wherein said test light source comprises a laser.

* * * * *